(12) United States Patent
Cho

(10) Patent No.: US 6,828,184 B2
(45) Date of Patent: Dec. 7, 2004

(54) METHOD OF MANUFACTURING SEMICONDUCTOR DEVICES

(75) Inventor: Ihl Hyun Cho, Daejeon (KR)

(73) Assignee: Hynix Semiconductor Inc., Kyungki-do (KR)

( * ) Notice: Subject to any disclaimer, the term of this patent is extended or adjusted under 35 U.S.C. 154(b) by 0 days.

(21) Appl. No.: 10/618,292

(22) Filed: Jul. 11, 2003

(65) Prior Publication Data

US 2004/0014288 A1 Jan. 22, 2004

(30) Foreign Application Priority Data

Jul. 12, 2002 (KR) .................... 10-2002-0040702

(51) Int. Cl.[7] .......................................... H01L 21/8238
(52) U.S. Cl. ..................... 438/201; 438/211; 438/258
(58) Field of Search ............................. 438/201, 211, 438/258, 261, 266, 275, 287, 585, 591, 745, 756, 757

(56) References Cited

U.S. PATENT DOCUMENTS

| | | | | |
|---|---|---|---|---|
| 4,229,755 A | * | 10/1980 | Custode ..................... | 257/326 |
| 5,668,035 A | | 9/1997 | Fang et al. | |
| 5,970,345 A | * | 10/1999 | Hattangady et al. ........ | 438/279 |
| 6,093,659 A | * | 7/2000 | Grider et al. ............... | 438/758 |
| 6,271,092 B1 | * | 8/2001 | Lee ............................ | 438/279 |
| 6,429,457 B1 | * | 8/2002 | Berggren et al. ............ | 257/60 |
| 6,458,663 B1 | * | 10/2002 | Moore et al. ............... | 438/287 |
| 6,551,884 B2 | * | 4/2003 | Masuoka .................... | 438/275 |
| 6,653,192 B1 | * | 11/2003 | Ryoo .......................... | 438/275 |
| 6,660,593 B2 | * | 12/2003 | Chiang et al. .............. | 438/275 |
| 6,667,511 B1 | * | 12/2003 | Fang .......................... | 257/321 |
| 6,670,248 B1 | * | 12/2003 | Ang et al. ................... | 438/287 |
| 6,699,743 B2 | * | 3/2004 | Moore et al. ............... | 438/216 |
| 6,703,278 B2 | * | 3/2004 | Wieczorek et al. ......... | 438/287 |
| 6,716,685 B2 | * | 4/2004 | Lahaug ....................... | 438/157 |
| 6,734,055 B1 | * | 5/2004 | Lin et al. .................... | 438/201 |

OTHER PUBLICATIONS

Stanley Wolf, Ph.D. and Richard N. Tauber, Ph.D., Silicon Processing for the VLSI Era, vol. 1: Process Technology, 1986, Lattice Press, p 518.*

Tadahiro Ohmi et al., "Dependence of Thin–Oxide Films Quality on Surface Microroughness," IEEE Transactions on Electron Devices, vol. 39, No. 3, pp. 537–545 (Mar. 1992).

C.T. Liu et al., "Severe Thickness Variation of Sub–3nm Gate Oxide Due to Si Surface Faceting, Poly–Si Intrusion, and Corner Stress," 1999 Symposium on VLSI Technology Digest of Technical Papers, pp. 75–76.

* cited by examiner

Primary Examiner—John F. Niebling
Assistant Examiner—Walter L. Lindsay, Jr.
(74) Attorney, Agent, or Firm—Marshall, Gerstein & Borun LLP

(57) ABSTRACT

Disclosed is a method of manufacturing semiconductor devices. In the process of simultaneously forming a high voltage device and a low voltage device, a photoresist film for patterning a gate oxide film in a high voltage device is removed in a wet mode using a solvent. The polysilicon film used as the gate electrode is then formed without applying a vacuum. It is thus possible to increase reliability of the gate oxide film, and prevent damage of the gate oxide film due to ozone plasma and penetration of a grain protrusion of the polysilicon film into the gate oxide film. Accordingly, the breakdown voltage characteristic of the gate oxide film is improved.

5 Claims, 3 Drawing Sheets

METHOD OF MANUFACTURING SEMICONDUCTOR DEVICES

BACKGROUND

1. Technical Field

A method of manufacturing semiconductor devices is disclosed, wherein a process of simultaneously forming a high voltage device and a low voltage device is carried out. More specifically, a photoresist film for patterning a gate oxide film in a high voltage device is removed in a wet mode using a solvent and the polysilicon film used as the gate electrode is formed without applying vacuum, whereby reliability of the gate oxide film is increased, damage of the gate oxide film due to ozone plasma is prevented and penetration of a grain protrusion of the polysilicon film into the gate oxide film is prevented, thus improving the breakdown voltage characteristic of the gate oxide film.

2. Background of the Related Art

In semiconductor devices in which a high voltage device operating at a high voltage and a low voltage device operating at a low voltage are simultaneously fabricated, the gate oxide film in the high voltage device is made thicker than the gate oxide film in the low voltage device to improve the breakdown voltage characteristic against the high voltage.

This method of manufacturing the semiconductor devices includes the steps of thickly forming a first gate oxide film on a semiconductor substrate, removing the first gate oxide film in a low voltage device region using a photoresist film pattern, removing the photoresist film pattern using ozone plasma, and then thinly forming a second gate oxide film in the low voltage region. Next, a polysilicon film for forming the gate electrode is formed. At this time, the polysilicon film is formed by applying vacuum several times while the polysilicon film is formed to have a given thickness. For example, in the process of forming the polysilicon film of a 2000 Å thickness, fair vacuums are applied. At this time, vacuum is applied once every time the polysilicon film reaches a thickness of 500 Å.

However, in the process of removing the photoresist film using ozone plasma, the photoresist film is not completely removed and remnants remain. This degrades reliability of the gate oxide film and the plasma also damages the gate oxide film.

Further, while the method of forming the polysilicon film by applying vacuum four times is good for dopant channeling prevention, as the grain protrusion of the polysilicon film penetrates into the gate oxide film, however, an interfacial roughness between the gate oxide film and polysilicon increases, thereby increasing the leakage current at a pre-tunneling region. This phenomenon is shown in FIG. 1. FIG. 1 is a graph illustrating current distribution depending on the gate voltage in the case where the polysilicon film of the gate electrode is formed by applying vacuum four times as described above. FIG. 1 illustrates the results of measuring about 25 dies. It could be said that the current is increased at the pre-tunneling region where the grain protrusion of polysilicon penetrates into the gate oxide film. Further, if the polysilicon film is formed by the above method, the process time is increased because of the multiple vacuum treatments required.

SUMMARY OF THE DISCLOSURE

Accordingly, to substantially obviate one or more problems described above, a method of manufacturing semiconductor devices is disclosed by which a photoresist film remnant does not remain after the removal process of the photoresist film, thereby improving reliability of a gate oxide film.

The disclosed method can also prevent a reduction in the breakdown voltage characteristic due to grain protrusion of polysilicon.

A preferred method comprises: forming an isolating film at a given region of a semiconductor substrate to define a first region and a second region; forming a first oxide film on the entire structure and then removing the first oxide film in the second region using a photoresist film pattern; removing the photoresist film pattern using a solvent, implementing an oxidization process to form a second oxide film on the semiconductor substrate in the second region; forming a polysilicon film on the entire structure and then patterning the polysilicon film to form gate electrodes in the first and second regions, respectively; and implementing an impurity ion implantation process to form junction regions at given regions on the semiconductor substrate.

Additional advantages and features of the disclosed method will be set forth in part in the description which follows and in part will become apparent to those having ordinary skill in the art upon examination of the following or may be learned from practice. Other advantages of the disclosed method may be realized and attained by the structure particularly pointed out in the written description and claims hereof as well as the appended drawings.

BRIEF DESCRIPTION OF THE DRAWINGS

The above and other features and advantages of the disclosed methods will be apparent from the following detailed description of the preferred embodiments in conjunction with the accompanying drawings, wherein.

DETAILED DESCRIPTION OF THE PRESENTLY PREFERRED EMBODIMENTS

Figure 1:
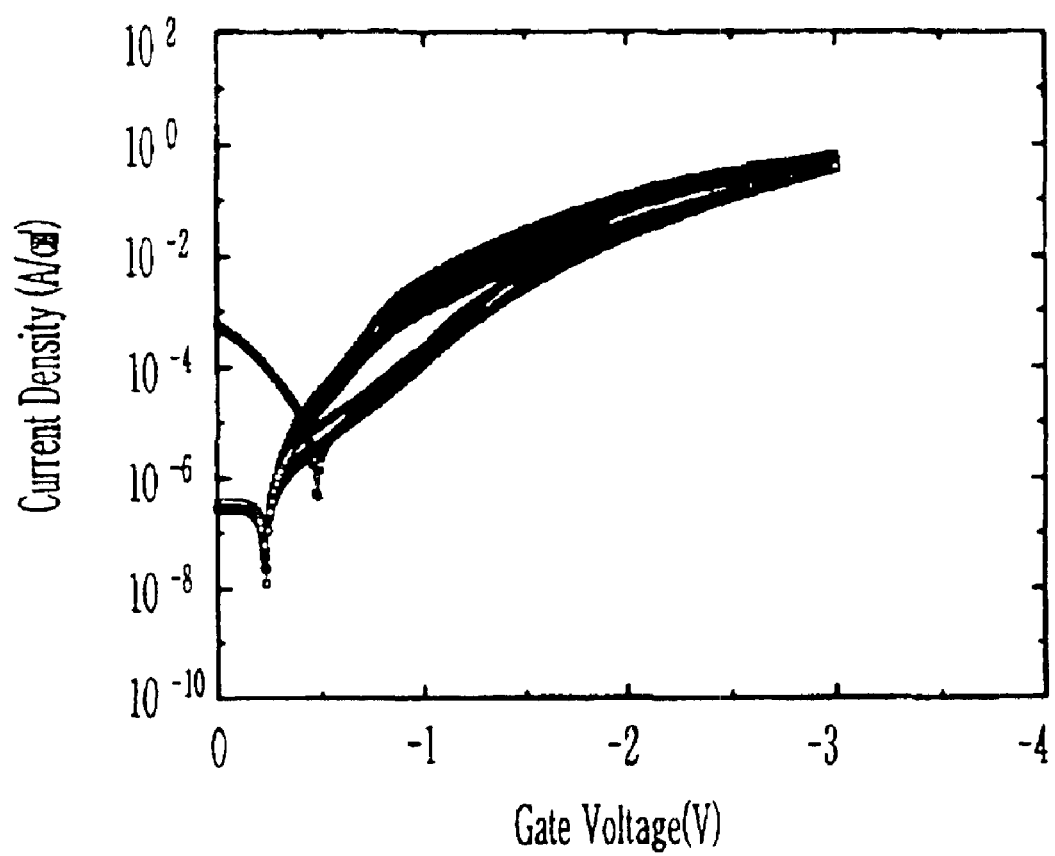
FIG. 1 is a graph illustrating current distribution depending on the gate voltage of a gate electrode when the polysilicon film is formed by applying vacuum four times during formation of the gate electrode.

Reference will now be made in detail to the preferred embodiments of the present invention, examples of which are illustrated in the accompanying drawings, in which like reference numerals are used to identify the same or similar parts. FIG. 2A–FIG. 2D are cross-sectional views of semiconductor devices for explaining a method of manufacturing the device according to a preferred embodiment.

Figure 2A:
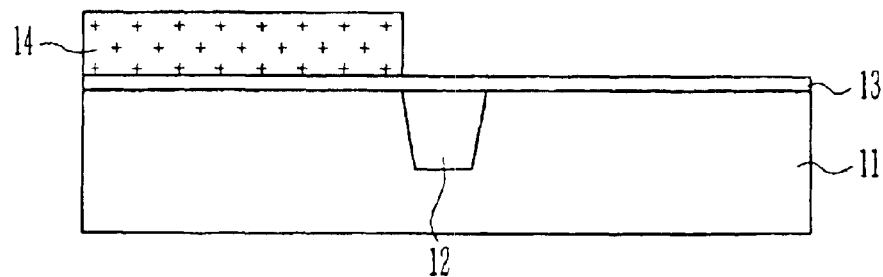
FIG. 2A–FIG. 2D are cross-sectional views of semiconductor devices for explaining a method of manufacturing the device according to a preferred embodiment.

Referring to FIG. 2A, an isolation film 12 is formed at a given region of a semiconductor substrate 11 to define a high voltage device region and a low voltage device region. An ion implantation process is then performed to form a well region. Next, the semiconductor substrate 11 is precleaned using a HF solution diluted with a mixture solution of NH$_4$OH/H$_2$O$_2$/H$_2$O. Thereafter, a first oxide film 13 is thickly formed on the entire structure. At this time, the first oxide film 13 is formed by oxidizing the semiconductor substrate 11 using vaporized $H_2O$ generated by pyrolysis of oxygen and hydrogen in the furnace. Then, a photoresist film 14 of i-line series, having a thickness of about 1 Å, is formed on the first oxide film 13. The photoresist film 14 is then patterned to expose the low voltage device region. Thereafter, the first oxide film 13 formed on the semiconductor substrate 11 in the low voltage device region is removed by wet etch using the patterned photoresist film 14 as a mask.

Figure 2B:
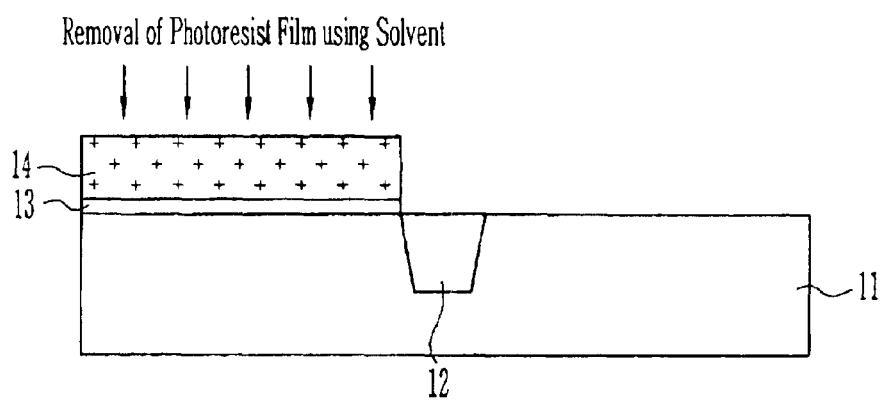

By reference to FIG. 2B, the photoresist film 14 formed in the high voltage device region is removed using a solvent. The solvent may include ethylcellsoluve acetate (ECA), methylamyl ketone (MAK), ethyl pyruvate (EP), ethyl lactate (EL), 3-methylmethoxy propionate (MMP), propyleneglycomonomethyl ether (PGME), propyleneglycolmonomethylether acetate (PGMEA), ethoxyethyl propionate (EEP), and the like.

Figure 2C:
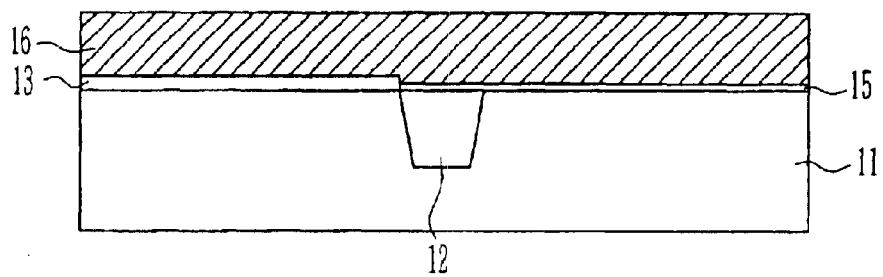

Referring to FIG. 2C, an oxidization process is implemented to form a second oxide film 15 having a thin thickness on the semiconductor substrate 11 in the low voltage device region. At this time, the first oxide film 13 is also grown by a given thickness. A polysilicon film 16 is then formed on the entire structure, wherein the polysilicon film 16 is formed by not applying vacuum and is formed at a temperature ranging from about 580° C. to about 630° C. using $SiH_4$ gas or $Si_2H_6$ gas. After the polysilicon film 16 is formed, an annealing process is implemented at a temperature ranging from about 800° C. to about 1000° C. in the furnace or a rapid thermal annealing equipment.

Figure 2D:
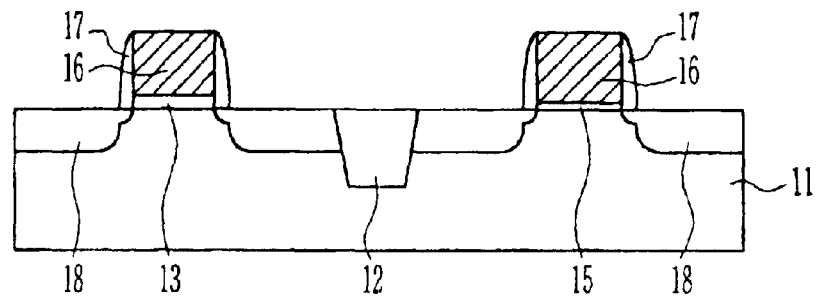

By reference to FIG. 2D, given regions of the polysilicon film 16 and the first oxide film 13 in the high voltage device region, and given regions of the polysilicon film 16 and the second oxide film 15 in the low voltage device region are etched to form first and second gate electrodes. A low concentration impurity ion implantation process is then implemented. Next, spacers 17 are formed at the sidewalls of the gate electrodes. Thereafter, a high concentration impurity ion implantation process is implemented to form junction regions 18 on the semiconductor substrate 11.

If the semiconductor devices are fabricated by the above process, the photoresist film is removed using a wet solvent. Therefore, particles generated during the process remain but the photoresist film remnants do not remain behind.

Figure 3:
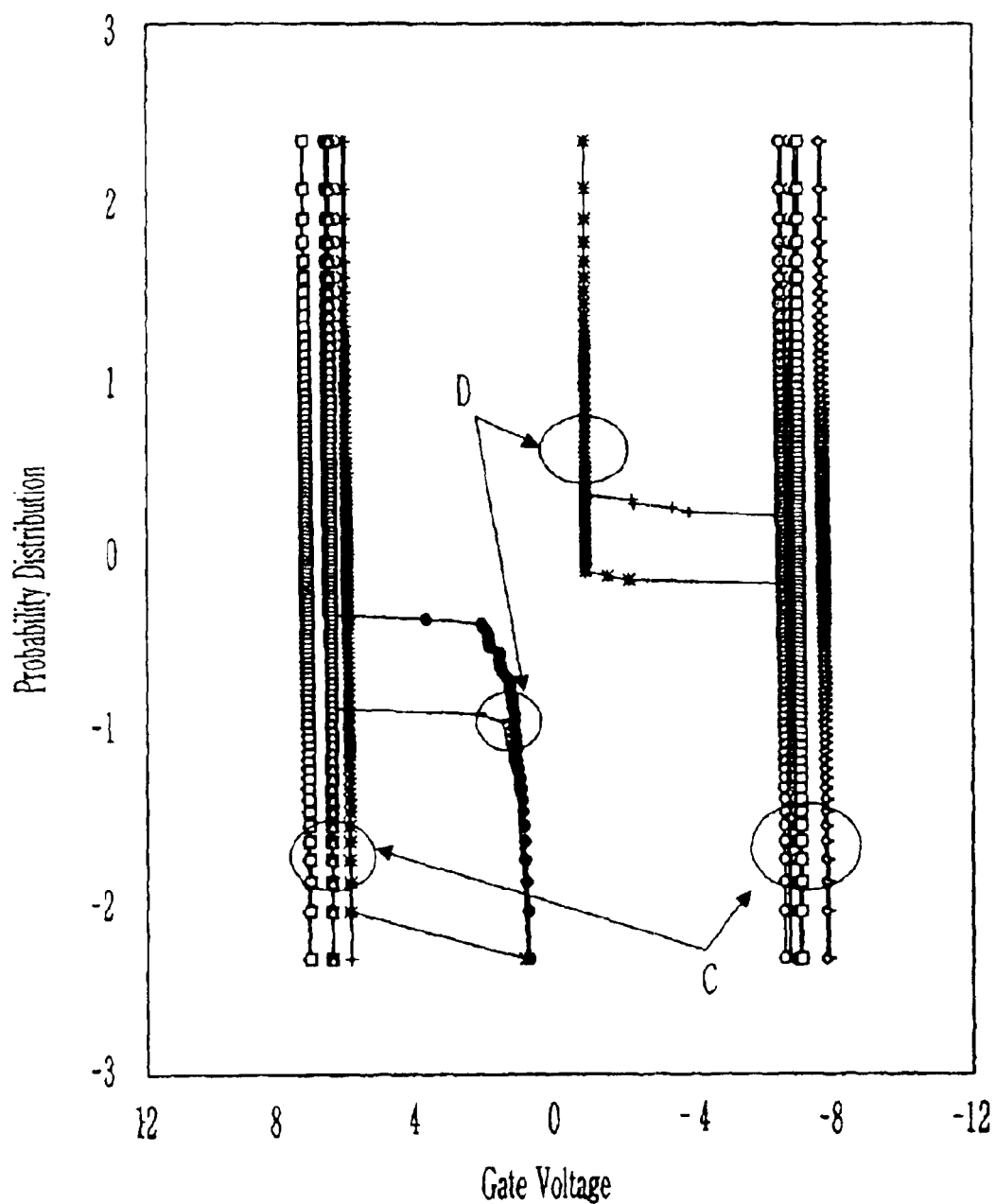
FIG. 3 is a graph illustrating breakdown voltage characteristics of a high voltage device in which the gate electrode is formed using the polysilicon film formed while applying a vacuum, and a high voltage device in which a gate electrode is formed using a polysilicon film that is formed without applying a vacuum.

Further, FIG. 3 is a graph illustrating breakdown voltage characteristics of a high voltage device D in which the gate electrode is formed using the polysilicon film formed while applying evaporation, and a high voltage device C in which a gate electrode is formed using a polysilicon film that is formed without applying vacuum.

As shown in FIG. 3, it could be seen that the high voltage device C has a high voltage breakdown voltage characteristic of 8V or −8V but the high voltage device D has a breakdown voltage of around 0V. It can be thus understood that the high voltage device C has a superior breakdown voltage characteristic than the high voltage device D.

As described above, as the photoresist film is removed in a wet mode using a solvent, a photoresist film remnant does not remain. Therefore, the disclosed method has advantageous effects that it can increase reliability of the gate oxide film and prevent damage of the gate oxide film due to ozone plasma.

Further, the polysilicon film is not formed by applying one or more vacuums and, as a result, penetration of a grain protrusion of the polysilicon film into the gate oxide film is prevented or at least minimized. Therefore, the disclosed method has new effects that it can improve the breakdown voltage characteristic of the gate oxide film and shorten the process time.

The forgoing embodiments are merely exemplary and are not to be construed as limiting the present invention. The present teachings can be readily applied to other types of apparatuses. The description of the disclosed method is intended to be illustrative, and not to limit the scope of the claims. Many alternatives, modifications, and variations will be apparent to those skilled in the art.

What is claimed is:

1. A method of manufacturing semiconductor devices, comprising:

forming an isolating film on a given region of a semiconductor substrate to define a first region and a second region;

forming a first oxide film on the entire structure and then removing the first oxide film from the second region using a photoresist film pattern;

removing the photoresist film pattern using a solvent;

implementing an oxidization process to form a second oxide film on the semiconductor substrate in the second region;

forming a polysilicon film on the entire structure and then patterning the polysilicon film to form gate electrodes in the first and second regions, respectively, and implementing an impurity ion implantation process to form junction regions at given regions on the semiconductor substrate.

2. The method as claimed in claim 1, wherein the first oxide film is formed thicker than the second oxide film.

3. The method as claimed in claim 1, wherein the photoresist film is formed using an i-line series photoresist material.

4. The method as claimed in claim 1, wherein the solvent includes any one of ethylcellsoluve acetate (ECA), methylamyl ketone (MAK), ethyl pyruvate (EP), ethyl lactate (EL), 3-methylmethoxy propionate (MMP), propyleneglycomonomethyl ether (PGME), propyleneglycolmonomethylether acetate (PGMEA) and ethoxyethyl propionate (EEP).

5. The method as claimed in claim 1, wherein the polysilicon film is formed without applying a vacuum and is formed using $SiH_4$ gas or $Si_2H_6$ gas at a temperature ranging from about 580° C. to about 630° C.

* * * * *